United States Patent
Li et al.

(10) Patent No.: US 10,553,974 B2
(45) Date of Patent: Feb. 4, 2020

(54) THERMAL SOLUTION ON LATCH FOR SODIMM CONNECTOR

(71) Applicant: INTEL CORPORATION, Santa Clara, CA (US)

(72) Inventors: Xiang Li, Portland, OR (US); George Vergis, Portland, OR (US); Douglas Heymann, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 5 days.

(21) Appl. No.: 15/721,546

(22) Filed: Sep. 29, 2017

(65) Prior Publication Data
US 2019/0103690 A1 Apr. 4, 2019

(51) Int. Cl.
*H01R 12/73* (2011.01)
*H05K 1/02* (2006.01)
*H01R 12/83* (2011.01)
*H01R 12/72* (2011.01)

(52) U.S. Cl.
CPC ......... *H01R 12/732* (2013.01); *H05K 1/0209* (2013.01); *H01R 12/721* (2013.01); *H01R 12/83* (2013.01)

(58) Field of Classification Search
CPC .... H05K 1/0209; H05K 1/021; H05K 1/0212; H01R 12/721; H01R 12/732; H01R 12/83
See application file for complete search history.

(56) References Cited

U.S. PATENT DOCUMENTS

| 5,980,282 A | 11/1999 | Cheng |
| 6,246,588 B1 | 6/2001 | Kim et al. |
| 6,629,855 B1 | 10/2003 | North et al. |
| 7,029,307 B1 | 4/2006 | Ling et al. |
| 7,033,197 B2 | 4/2006 | Ling et al. |
| 7,458,821 B2 | 12/2008 | Willis et al. |
| 7,500,863 B2 | 3/2009 | Ringler et al. |
| 9,391,378 B2 | 7/2016 | Leddige et al. |
| 9,935,384 B1 | 4/2018 | Li et al. |
| 2002/0009914 A1* | 1/2002 | Yahiro ............... H01R 12/7005 439/326 |

(Continued)

OTHER PUBLICATIONS

Pending U.S. Appl. No. 15/280,281, filed Sep. 29, 2016, invented by Li et al.

(Continued)

*Primary Examiner* — Jacob R Crum
(74) *Attorney, Agent, or Firm* — Konrad Raynes Davda & Victor LLP; Alan S. Raynes

(57) ABSTRACT

Embodiments include devices, systems, and methods relating to removing heat from a memory module in a connector. One embodiment relates to a memory module connector comprising a first arm, a second arm, and a body portion positioned between the first arm and the second arm, the body portion configured to accept a memory module therein. The memory module connector includes a structure coupled to the first arm and configured to be electrically coupled to a printed circuit board. The memory module connector also includes a heat spreader coupled to the first arm, the heat spreader configured to be brought into thermal contact with a memory module component. Other embodiments are described and claimed.

20 Claims, 4 Drawing Sheets

(56) References Cited

U.S. PATENT DOCUMENTS

| | | | | |
|---|---|---|---|---|
| 2005/0270758 A1* | 12/2005 | Imazato | .................. | G11C 5/04 |
| | | | | 361/816 |
| 2010/0167557 A1* | 7/2010 | Hoang | .................. | H05K 1/117 |
| | | | | 439/62 |
| 2011/0143579 A1* | 6/2011 | Karabatsos | ............ | H01R 12/62 |
| | | | | 439/485 |
| 2011/0212642 A1* | 9/2011 | Franke | .................. | H01R 12/83 |
| | | | | 439/326 |
| 2013/0052847 A1* | 2/2013 | Figuerado | ............... | G06F 1/185 |
| | | | | 439/157 |
| 2014/0051269 A1* | 2/2014 | Chang | ................. | H01R 12/722 |
| | | | | 439/68 |
| 2014/0106579 A1* | 4/2014 | Clayton | .............. | H01R 13/627 |
| | | | | 439/67 |
| 2014/0185226 A1* | 7/2014 | Lam | ....................... | G06F 21/86 |
| | | | | 361/679.31 |
| 2014/0327630 A1* | 11/2014 | Burr | ...................... | G06F 3/0488 |
| | | | | 345/173 |
| 2015/0171535 A1 | 6/2015 | Li et al. | | |
| 2018/0046823 A1* | 2/2018 | Durham | ................. | G06F 21/53 |
| 2018/0190330 A1* | 7/2018 | Yoon | ....................... | G11C 7/04 |

OTHER PUBLICATIONS

Seagate Business Storage User Manual 4-Bay Rackmount NAS, Feb. 17, 2016.

\* cited by examiner

THERMAL SOLUTION ON LATCH FOR SODIMM CONNECTOR

TECHNICAL FIELD

Embodiments described herein generally relate to devices and methods for removing heat from a memory module.

BACKGROUND

Computing systems often utilize memory modules such as dual in-line memory modules (DIMMs) for providing memory that is coupled through a connector to a printed circuit board (PCB) such as a motherboard. Certain types of computer systems such as, for example, laptops and other portable computers, may utilize a more compact memory module, known as a small outline dual in-line memory module (SODIMM), for providing memory. The desire for increased performance of systems utilizing memory modules may lead to designs that generate increased heat, which in turn creates a need for thermal solutions.

BRIEF DESCRIPTION OF THE DRAWINGS

Embodiments are described by way of example, with reference to the accompanying drawings, which are not drawn to scale, in which like reference numerals refer to similar elements.

DETAILED DESCRIPTION

References in the specification to "embodiments," "certain embodiments," "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to devices and methods for removing heat from a memory module such as a SODIMM.

As memory integrated circuits become more advanced, additional bandwidth and capacity, as well as increased efficiency, are desired. Performance and efficiency gains may be achieved by including a voltage regulator on a SODIMM. However, a voltage regulator may operate at an elevated temperature, so a thermal solution is desirable to minimize any deleterious effects such elevated temperature may have on the system. Certain embodiments are directed towards a solution for removing excess heat from a component such as the voltage regulator on a SODIMM.

Figure 1:
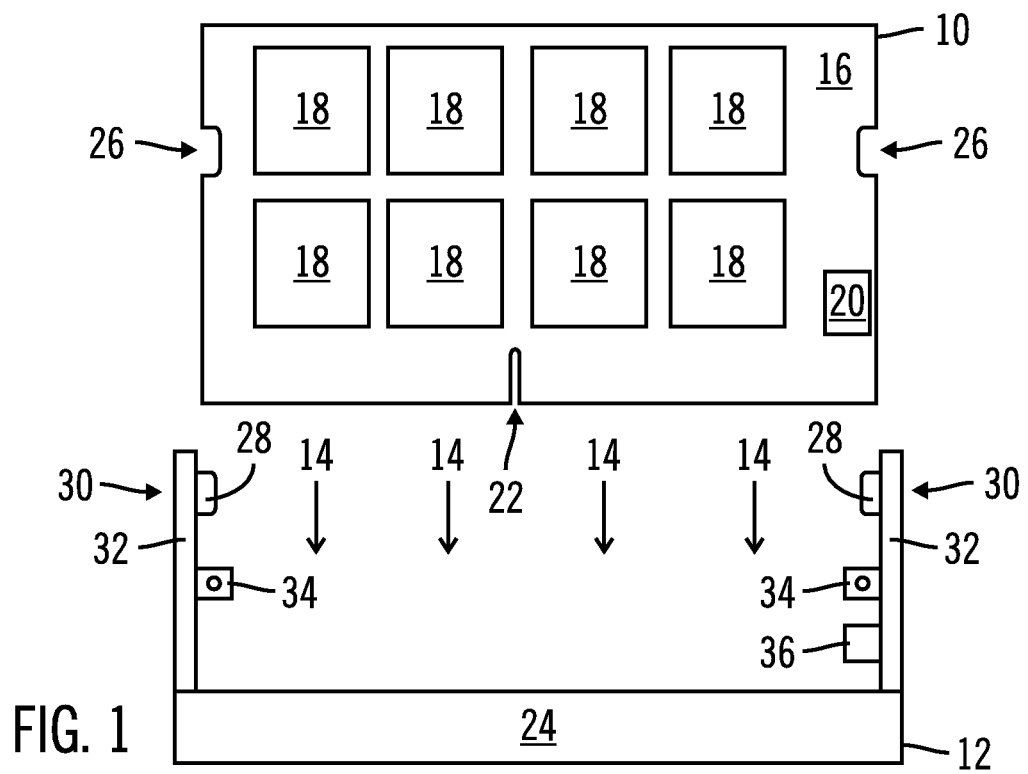
FIG. 1 illustrates a SODIMM and connector into which the SODIMM may be positioned, in accordance with certain embodiments.

FIG. 1 illustrates a view of a memory system including a SODIMM 10 that fits into SODIMM connector 12, with arrows 14 indicating the direction of insertion. The SODIMM 12 may comprise a printed circuit card 16 having a plurality of memory chips 18 positioned thereon. Other components may be provided on the printed circuit card 16. Component 20 is positioned near a side of the printed circuit card 16 and may in certain embodiment comprise a voltage regulator 20, which may be implemented as a power management integrated circuit (PMIC) chip. The SODIMM 10 also includes a notch 22 on a bottom region thereof, for aligning with a key in the main body portion 24 of the connector 12 to ensure that the SODIMM 10 is properly positioned therein. The sides of the SODIMM 10 may include a mounting latch recess 26, into which a detent 28 extending on an arm 32 of a latch 30 (also known as a retaining clip) on the connector 12 can be positioned to hold the SODIMM 10 in place in the connector 12.

The SODIMM connector 12 embodiment illustrated in FIG. 1 includes latches 30 including arms 32 for holding the SODIMM therein. At least part of a latch 30 is moveable so that the SODIMM 10 can be inserted into the connector 14 and the detent 28 on the arm 32 positioned in the recess 26 on each side of the SODIMM 10. The arm 32 of the latch 30 may include the detent 28 and number of other features, including, but not limited to, a retention tab 34 structure which may be coupled to an underlying motherboard by, for example, soldering, and which may act as a ground plane connection.

Embodiments also include a heat spreader 36 positioned on an arm 32 of the latch 30. The heat spreader 36 may in certain embodiments comprise a structure that extends inward from the arm 32 and can be positioned to be in contact with the component 20 on the SODIMM 10. The heat spreader 36 may be formed from a material including, but not limited to, a metal that can transmit heat so that heat is transmitted away from the component 20 on the SODIMM 10. As noted above, the latch 30 may include a retention tab 34 extending from the arm 32 that is coupled to an underlying motherboard. Heat may be transferred from the component 20 on the SODIMM 12 through the heat spreader 36 along the arm 32 and through the retention tab 34 to be dissipated through the motherboard.

Figure 2:
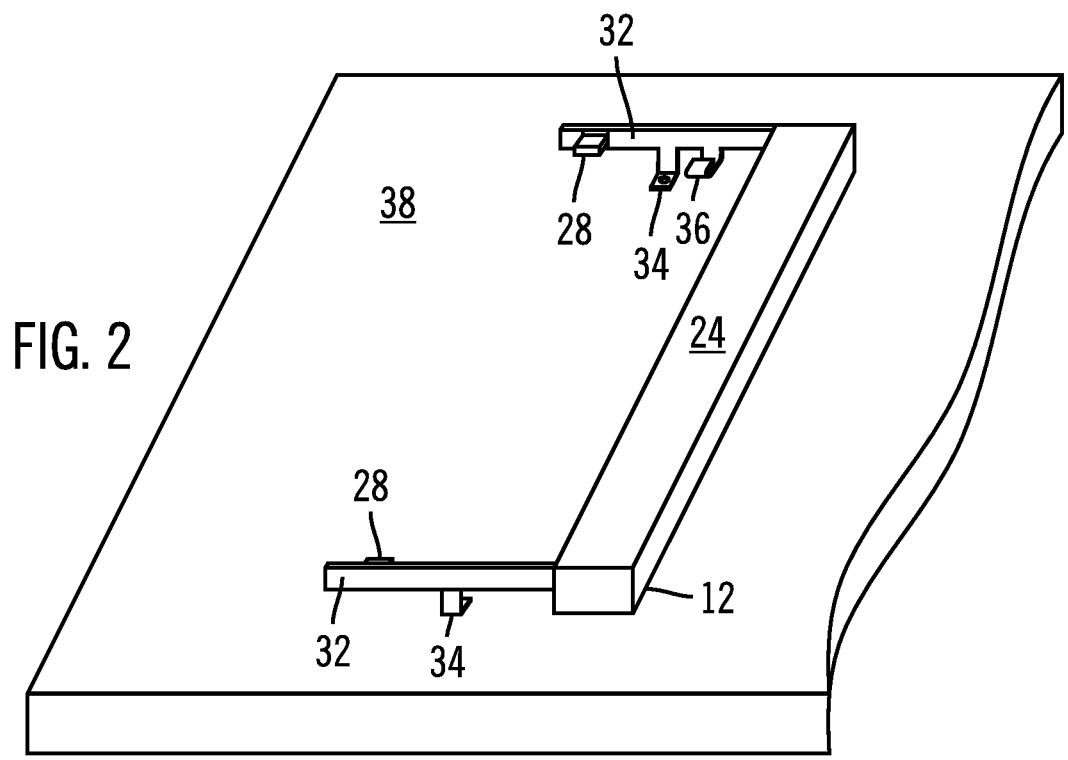
FIG. 2 illustrates a SODIMM connector positioned on a printed circuit board, in accordance with certain embodiments.

FIG. 2 illustrates a view of SODIMM connector 12 positioned on a PCB such as a motherboard 38. The arms 32 illustrated in FIG. 2 each include detent 28 for fitting into a recess in a SODIMM (such as the recess 26 illustrated in FIG. 1), and a retention tab 34 that is electrically coupled to the motherboard 38. A SODIMM positioned in the connector 12 may be oriented substantially parallel to the motherboard 38. FIG. 2 also illustrates heat spreader 36 extending inward from the arm 32 shown on the upper portion of figure. The heat spreader 36 may be positioned at a higher vertical level than the portion of the retention tab 34 that is coupled to the motherboard 38, so that it can contact a component such as a PMIC chip on the SODIMM when the SODIMM is positioned in the connector 12.

Figure 3:
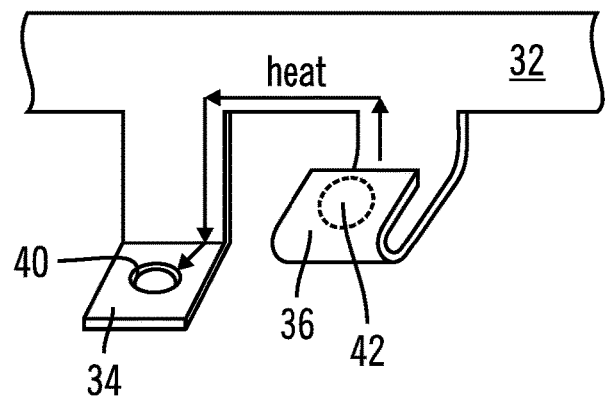
FIG. 3 illustrates certain features on an arm of a SODIMM connector, in accordance with certain embodiments.

FIG. 3 illustrates a view of a portion of a SODIMM connector arm 32 showing the retention tab 34 and heat spreader 36. The heat spreader 36 may be configured to include a spring load feature that can flex so that when brought into thermal contact with a component on a SODIMM, a good connection can be maintained. If desired, any suitable thermal interface material 42 may be positioned on the surface of the heat spreader between the heat spreader 36 and the component the heat spreader will be brought into thermal contact with, to assist in the heat transfer from the component to the heat spreader 36. FIG. 3 also illustrates arrows showing a pathway through which heat may travel through the heat spreader 36, then along a portion of the arm 32, and to the retention tab 34 extending from the arm 32. The retention tab 34 may be soldered to a PCB such as the motherboard 38 illustrated in FIG. 2, and heat may be transmitted through the retention tab 34 and into the motherboard 38. The retention tab 34 may include an opening 40 therein, to enhance the solder connection between the retention tab 34 and the motherboard it will be coupled thereto.

In certain embodiments the heat spreader 36 may take the form of a metal structure shaped as a spring to provide a spring load. As illustrated in FIG. 3, this may include a structure such as a metal or other material that can be bent or otherwise formed so that an end section can flex. The metal structure may be in certain embodiments integral to the latch arm 32 or may be coupled thereto so that a good thermal contact is achieved. Any other type of structure (for example, a cylindrical spring) than can provide a good thermal contact may be utilized as a heat spreader. By positioning the heat spreader close to the retention tab (which has as a primary function acting as a ground plane pathway), one can achieve a thermal solution to the problem of excess heat generated by a component such as a PMIC chip by using a compact heat spreader design as described herein and taking advantage of the location of the latch arm and retention tab on the SODIMM connector.

Figure 4:
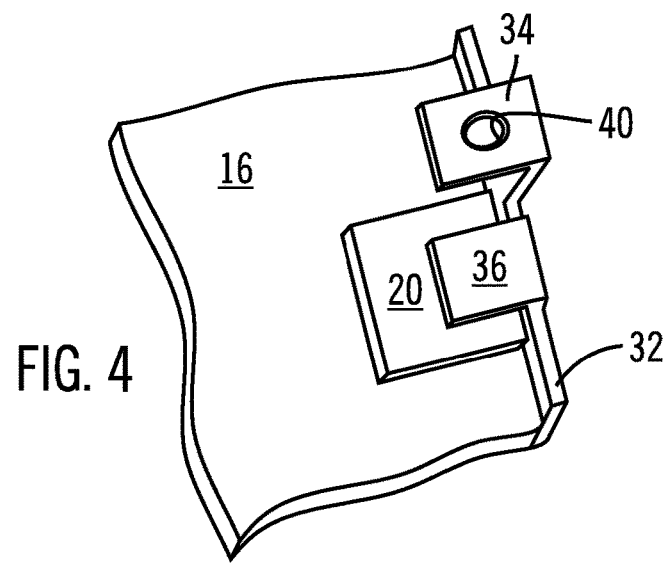
FIG. 4 illustrates a view of a component on a SODIMM in contact with a heat spreader, in accordance with certain embodiments.

FIG. 4 illustrates a view looking upwards from just above a motherboard, showing a portion of a SODIMM inserted into a SODIMM connector (such as the SODIMM 10 and SODIMM connector 12 of FIG. 1). FIG. 4 illustrates printed circuit card 16 on which component 20 positioned, with heat spreader 36 positioned in thermal contact with the component 20. FIG. 4 also illustrates the retention tab 34, positioned adjacent to the heat spreader 36 along the latch arm 32. While the illustrated heat spreader 36 is shown in contact over only a portion of the surface of the component 20, embodiments may also include a heat spreader sized to cover the entire surface of a component.

Figure 5:
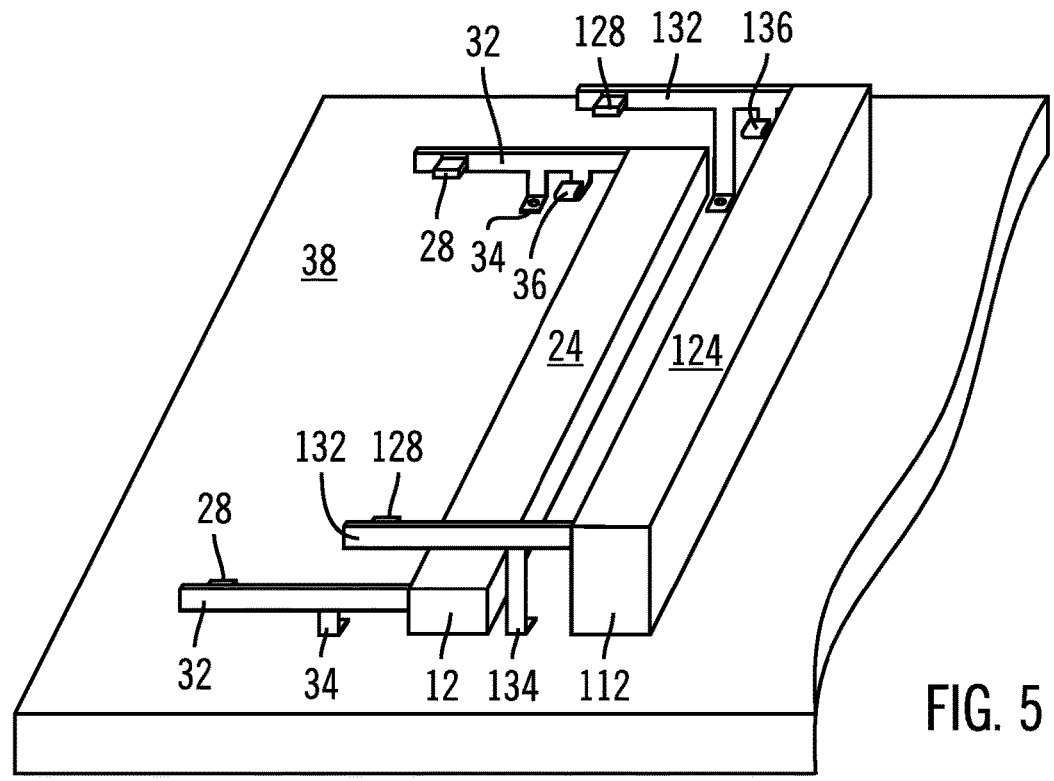
FIG. 5 illustrates a plurality of SODIMM connectors in a stack configuration, in accordance with certain embodiments.

SODIMMs and SODIMM connectors may be positioned in a variety of configurations on a motherboard. For example, FIG. 5 illustrates an embodiment including a stacked configuration including SODIMM connectors 12, 112 each including a heat spreader 36, 136 on one of the latch arms 32, 132. Each of the connectors 12, 112 also includes detents 28, 128 and retention tabs 34, 134 on both latch arms 32, 132. The connector 112 is taller than the connector 12, with a body section 124 of the connector 112 having a height that is greater than the height of the body portion 24 of the connector 14. A portion of each of the latch arms 132 of the connector 112 extends over part of the connector 14. Due to the taller structure of the connector 112, the retention tabs 134 extends a greater distance vertically downward from the arms 132 than the retention tabs 34 extend from the arms 32 on the connector 12. The stacked configuration enables two SODIMMS to be overlapping, to efficiently utilize the area on the underlying motherboard 38.

Figure 6:
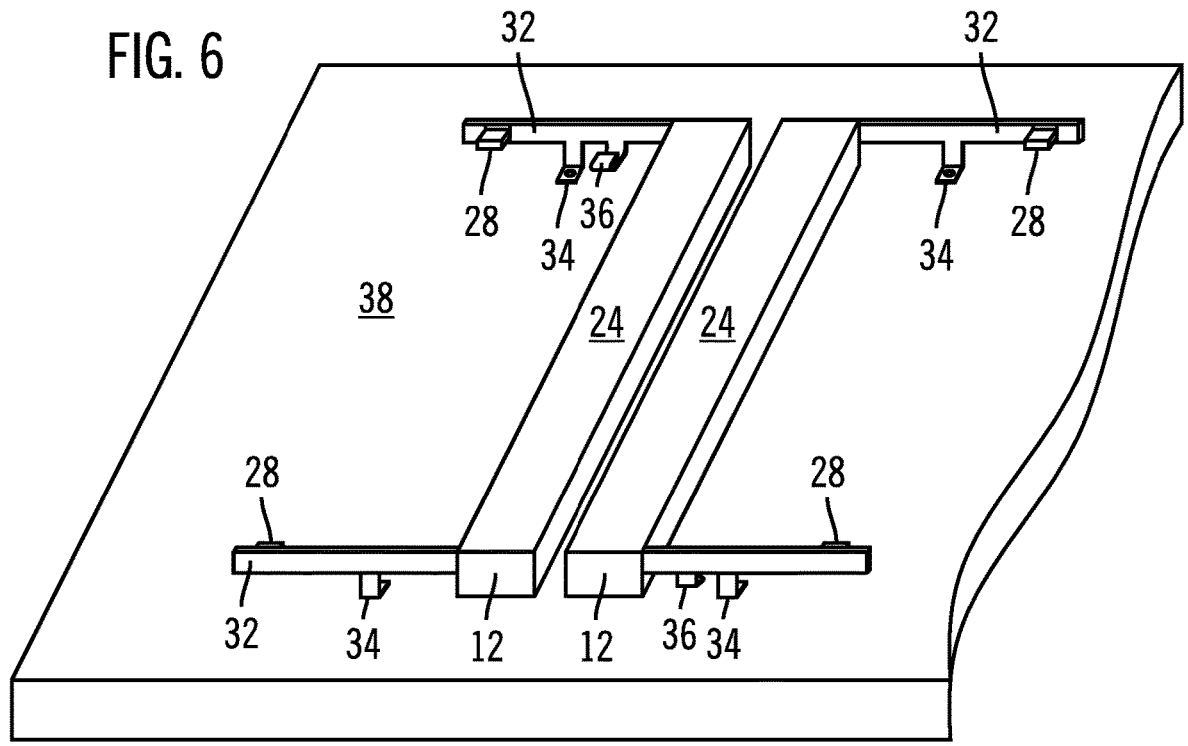
FIG. 6 illustrates a plurality of SODIMM connectors in a butterfly configuration, in accordance with certain embodiments.

FIG. 6 illustrates an embodiment including two SODIMM connectors 12 configured in a butterfly or back-to-back configuration on a motherboard 38, with each of the connectors 12 including a heat spreader 36 on one of the latch arms 32. Each of the connectors 12 also includes detents 28 and retention tabs 34 on both latch arms 32. In this configuration the connectors 12 are similar to one another but face in opposite directions on the motherboard 38. The butterfly configuration enables the system to have a minimized vertical profile.

Figure 7:
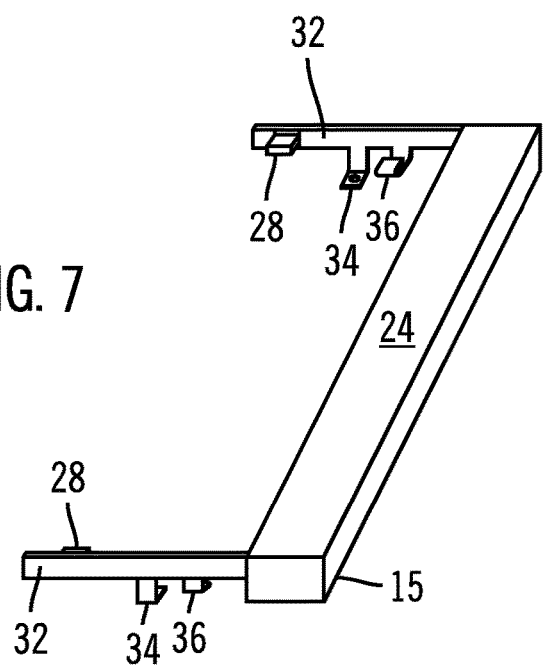
FIG. 7 illustrates a SODIMM connector including a heat spreader on both arm structures, in accordance with certain embodiments.

Certain embodiments may include SODIMM connectors including a plurality of heat spreaders. For example, FIG. 7 illustrates a SODIMM connector 15 including latch arms 32 each including a heat spreader 36 in addition to a retention tab 34 and detent 28. While this embodiment illustrates two heat spreaders 36, the presence of additional heat spreaders 36 is also possible.

Figure 8:
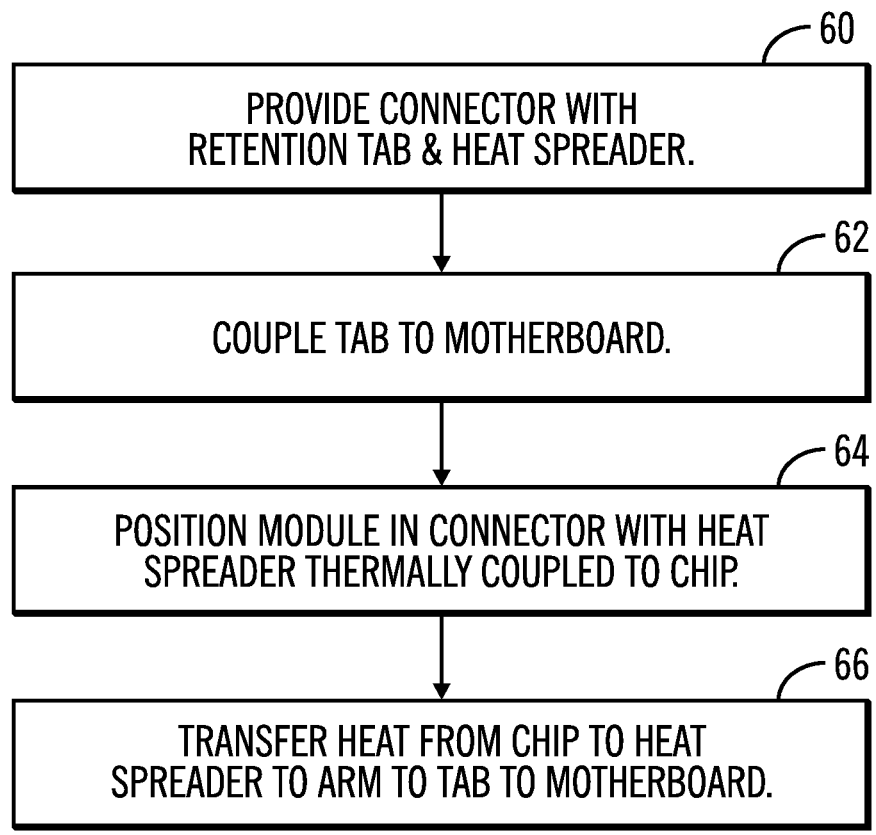
FIG. 8 illustrates a flowchart of operations, in accordance with certain embodiments.

FIG. 8 illustrates a flowchart of operations in accordance with certain embodiments. Block 60 is providing a connector for coupling a module such as, for example, a SODIMM, to a PCB, the connector comprising a structure including a retention tab for coupling to a PCB such as a motherboard and a heat spreader for transferring heat to the PCB through the heat spreader and the retention tab, with the connector configured in certain embodiments to include an arm on which both the retention tab (which may be used as a ground plane pathway) and the heat spreader are positioned. Block 62 is coupling the retention tab to the PCB. Block 64 is positioning a module such as a SODIMM in the connector with the heat spreader in thermal contact with a component such as a PMIC on the SODIMM. Block 66 transferring heat from the component on the SODIMM to the heat spreader, through the connector arm, through the retention tab, and into the motherboard where it can be dissipated.

Figure 9:
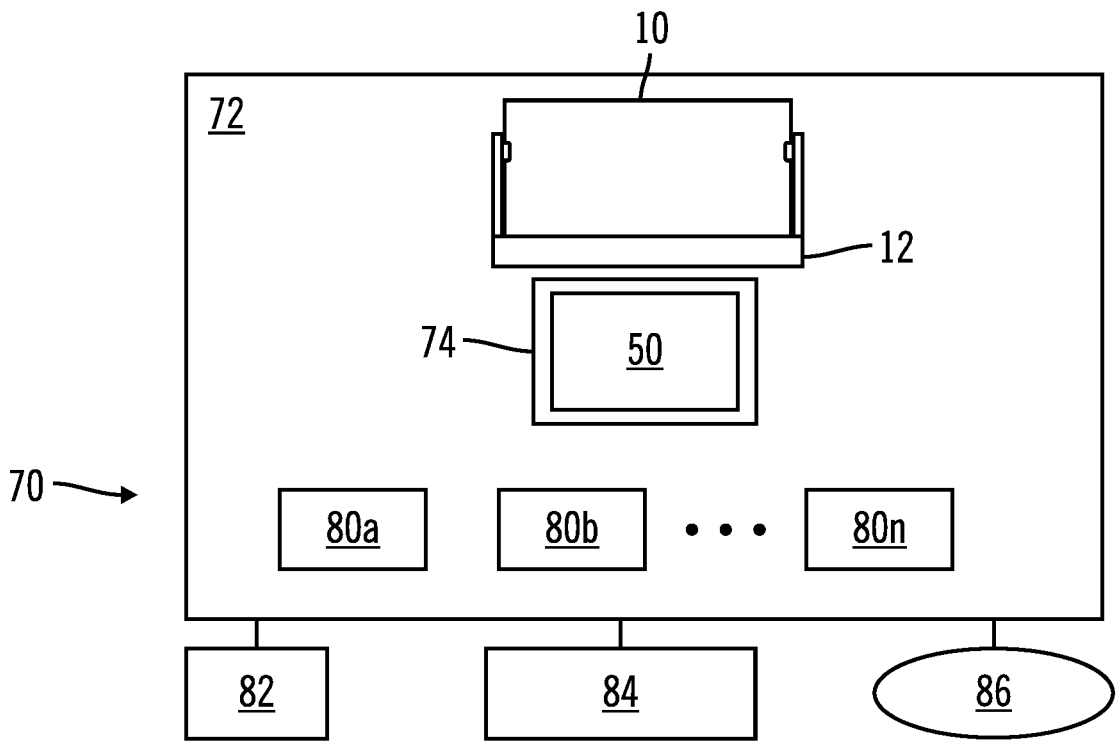
FIG. 9 illustrates an electronic system arrangement in which embodiments may find application.

Assemblies including components formed as described in embodiments above may find application in a variety of electronic components. FIG. 9 schematically illustrates one example of an electronic system environment in which aspects of described embodiments may be embodied. Other embodiments need not include all of the features specified in FIG. 9, and may include alternative features not specified in FIG. 9. The system 70 of FIG. 9 may include at least one die such as a CPU 50 positioned in a package substrate 74, which is then coupled to a substrate such as a printed circuit board (PCB) 56.

The system 70 as illustrated in FIG. 9 includes a SODIMM connector 12 such as described above, including SODIMM 10 positioned therein. The connectors may be used to couple memory to the PCB or motherboard 72. While FIG. 9 illustrates one SODIMM connector and SODIMM, other quantities are possible. The connector 12 may be configured and formed in accordance with embodiments such as described above, including the presence of the heat spreader 36 adjacent to the retention tab 34 on the arm 32, as illustrated in FIG. 1.

The system 70 may further include one or more controllers 80$a$, 80$b$ . . . 80$n$, for a variety of components, which may also be disposed on the PCB 72. The system 70 may be formed with additional components, including, but not limited to, storage 82, display 84, and network connection 86. The system 70 may comprise any suitable computing device, including, but not limited to, a mainframe, server, personal computer, cloud computing device, workstation, laptop, tablet, netbook, handheld computer, handheld gaming device, handheld entertainment device (for example, MP3 (moving picture experts group layer—3 audio) player), PDA (personal digital assistant), watch, fitness device, smart phone or other telephony device (wireless or wired), network appliance, virtualization device, storage controller, network controller, router, etc.

Various features of embodiments described above may be implemented with respect to other embodiments, including apparatus and method embodiments. The order of certain operations as set forth in embodiments may also be modified. Specifics in the examples may be used anywhere in one or more embodiments.

In the present description, various features are grouped together for the purpose of streamlining the disclosure. This method of disclosure is not to be interpreted as reflecting an intention that the claimed embodiments of the invention require more features than are expressly recited in each claim. Rather, as the claims reflect, inventive subject matter may lie in less than all features of a single disclosed embodiment. Thus the claims are hereby incorporated into the Detailed Description, with each claim standing on its own as a separate embodiment.

While certain exemplary embodiments are described herein and shown in the accompanying drawings, it is to be understood that such embodiments are merely illustrative and not restrictive, and that embodiments are not restricted to the specific constructions and arrangements shown and described since modifications may occur to those having ordinary skill in the art. For example, in certain embodiments the size and shape of the heat spreader and the retention tab may differ from those illustrated in the figures and described above. In addition, as illustrated in the embodiment illustrated in FIG. 1, the retention tab 34 is spaced a greater distance away from the body portion 24 than the heat spreader 36 is spaced away from the body portion 24 along the arm 32. Depending on the position of the retention tab and the component positioned on the DIMM from which heat is desired to be transferred, in other embodiments the heat spreader could be spaced a greater distance away from the body portion than the retention tab is spaced away from the body portion along the arm.

The terms "a" and "an" mean "one or more", unless expressly specified otherwise. Terms such as "first", "second", and the like may be used herein and do not necessarily denote any particular order, quantity, or importance, but are used to distinguish one element from another. Terms such as "upper", "lower", "top", "bottom", and the like may be used for descriptive purposes only and are not to be construed as limiting.

Devices that are in communication with each other need not be in continuous communication with each other, unless expressly specified otherwise. In addition, devices that are in communication with each other may communicate directly or indirectly through one or more intermediaries. A description of an embodiment with several components in communication with each other does not imply that all such components are required. Embodiments may be manufactured, used, and contained in a variety of positions and orientations.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

EXAMPLES

The following examples pertain to various embodiments. Specifics in the Examples may be used anywhere in one or more embodiments.

Example 1 is a memory module connector comprising: a first arm; a second arm; a body portion positioned between the first arm and the second arm, the body portion configured to accept a memory module therein; a structure coupled to the first arm and configured to be electrically coupled to a printed circuit board; and a heat spreader coupled to the first arm, the heat spreader configured to be brought into thermal contact with a memory module component.

In Example 2, the subject matter of Examples 1 and 3-7 can optionally include wherein the heat spreader comprises a spring.

In Example 3, the subject matter of Examples 1-2 and 4-7 can optionally include wherein at least one of the structure and the heat spreader are integral to the first arm.

In Example 4, the subject matter of Examples 1-3 and 5-7 can optionally include wherein the structure coupled to the first arm and configured to be electrically coupled to the printed circuit board is adapted to provide a ground plane pathway to the printed circuit board.

In Example 5, the subject matter of Examples 1-4 and 6-7 can optionally include wherein the a structure coupled to the first arm and configured to be electrically coupled to a printed circuit board is spaced a greater distance away from the body portion than the heat spreader is spaced away from the body portion along the first arm.

In Example 6, the subject matter of Examples 1-5 and 7 can optionally include an additional structure coupled to the second arm and configured to be electrically coupled to the printed circuit board; and an additional heat spreader coupled to the second arm.

In Example 7, the subject matter of Examples 1-6 can optionally include wherein the memory module comprises a small outline dual in-line memory module (SODIMM).

Example 8 is a system comprising: a memory module including a plurality of memory chips and an additional component thereon; a printed circuit board; a connector coupled to the printed circuit board, the connector configured to accept the memory module therein, the connector comprising a first arm, a second arm, and a body portion between the first arm and the second arm; the connector including a structure coupled to the first arm that is positioned to provide a ground plane pathway from the connector to the printed circuit board; the connector including a heat spreader coupled to the first arm; and the additional component being positioned in thermal contact with the heat spreader.

In Example 9, the subject matter of Examples 8 and 10-19 can optionally include wherein the additional component comprises a voltage regulator.

In Example 10, the subject matter of Examples 8-9 and 11-19 can optionally include wherein the additional component comprises a power management integrated circuit.

In Example 11, the subject matter of Examples 8-10 and 12-19 can optionally include wherein the structure positioned to provide a ground plane pathway comprises a retention tab soldered to the printed circuit board.

In Example 12, the subject matter of Examples 8-11 and 13-19 can optionally include wherein the heat spreader is configured to provide a spring load on the additional component.

In Example 13, the subject matter of Examples 8-12 and 14-19 can optionally include a thermal interface material between the heat spreader and the additional component.

In Example 14, the subject matter of Examples 8-13 and 15-19 can optionally include wherein at least one of the structure and the heat spreader are integral to the first arm.

In Example 15, the subject matter of Examples 8-14 and 16-19 can optionally include wherein the structure is spaced a greater distance away from the body portion than the heat spreader is spaced away from the body portion along the first arm.

In Example 16, the subject matter of Examples 8-15 and 17-19 can optionally include wherein the memory module comprises a small outline dual in-line memory module (SODIMM), and the connector comprises a SODIMM connector.

In Example 17, the subject matter of Examples 8-16 and 18-19 can optionally include an additional structure coupled to the second arm to provide a ground plane pathway to the printed circuit board; and an additional heat spreader coupled to the second arm.

In Example 18, the subject matter of Examples 8-17 and 19 can optionally include wherein the heat spreader comprises a spring.

In Example 19, the subject matter of Examples 8-18 can optionally include wherein the memory module is positioned substantially parallel to the printed circuit board.

Example 20 is a method comprising: providing a memory module connector with a structure configured to provide a ground plane pathway from the memory module connector to a printed circuit board; and providing the memory module connector with a heat spreader positioned to transmit heat from a component on a memory module through the structure configured to provide the ground plane pathway and to the printed circuit board.

In Example 21, the subject matter of Examples 20 and 22-23 can optionally include wherein the structure configured to provide the ground plane pathway and the heat spreader are both coupled to an arm of the memory module connector.

In Example 22, the subject matter of Examples 20-21 and 23 can optionally include wherein the structure configured to provide the ground plane pathway and the heat spreader are formed to be integral to an arm of the memory module connector.

In Example 23, the subject matter of Examples 20-22 can optionally include wherein the component comprises a power management integrated circuit.

Example 24 is a method comprising: providing a memory module connector including an arm, the arm including a retention tab and a heat spreader thereon; coupling the retention tab to a printed circuit board; positioning a memory module in the memory module connector so that the heat spreader is in thermal contact with a component on the memory module.

In Example 25, the subject matter of Examples 24 and 26-27 can optionally include transferring heat from the component through the heat spreader and through the retention tab to the printed circuit board.

In Example 26, the subject matter of Examples 24-25 and 27 can optionally include wherein at least one of the retention tab and the heat spreader are formed to be integral to an arm of the memory module connector.

In Example 27, the subject matter of Examples 24-26 can optionally include wherein the component comprises a power management integrated circuit.

Example 28 is a memory module connector comprising: means for transferring heat from an arm of the memory module connector to a printed circuit board; and means for transferring heat from a component on a memory module to the arm of the memory module connector.

Example 29 is an apparatus comprising means to perform a method as claimed in any preceding claim.

Example 30 is machine-readable storage including machine-readable instructions, when executed, to implement a method or realize an apparatus as claimed in any preceding claim.

What is claimed:

1. A memory module connector comprising:
   a first arm;
   a second arm;
   a body portion positioned between the first arm and the second arm, the body portion configured to accept a memory module therein;
   a structure coupled to the first arm and configured to be electrically coupled to a printed circuit board; and
   a heat spreader coupled to the first arm, the heat spreader configured to be brought into direct thermal contact with a memory module component.

2. The memory module connector of claim 1, wherein the heat spreader comprises a spring.

3. The memory module connector of claim 1, wherein at least one of the structure and the heat spreader are integral to the first arm.

4. The memory module connector of claim 1, wherein the structure coupled to the first arm and configured to be electrically coupled to the printed circuit board is adapted to provide a ground plane pathway to the printed circuit board.

5. The memory module connector of claim 1, wherein the structure coupled to the first arm and configured to be electrically coupled to a printed circuit board is spaced a greater distance away from the body portion than the heat spreader is spaced away from the body portion along the first arm.

6. The memory module connector of claim 1, further comprising an additional structure coupled to the second arm and configured to be electrically coupled to the printed circuit board; and an additional heat spreader coupled to the second arm.

7. A system comprising:
   a memory module including a plurality of memory chips and an additional component thereon;
   a printed circuit board;
   a connector coupled to the printed circuit board, the connector configured to accept the memory module therein, the connector comprising a first arm, a second arm, and a body portion between the first arm and the second arm;
   the connector including a structure coupled to the first arm that is positioned to provide a ground plane pathway from the connector to the printed circuit board;
   the connector including a heat spreader coupled to the first arm; and
   the additional component being positioned in direct thermal contact with the heat spreader.

8. The system of claim 7, wherein the additional component comprises a voltage regulator.

9. The system of claim 7, wherein the additional component comprises a power management integrated circuit.

10. The system of claim 7, wherein the structure positioned to provide a ground plane pathway comprises a retention tab soldered to the printed circuit board.

11. The system of claim 7, wherein the heat spreader is configured to provide a spring load on the additional component.

12. The system of claim 7, further comprising a thermal interface material between the heat spreader and the additional component.

13. The system of claim 7, wherein at least one of the structure and the heat spreader are integral to the first arm.

14. The system of claim 7, wherein the structure is spaced a greater distance away from the body portion than the heat spreader is spaced away from the body portion along the first arm.

15. The system of claim 7, wherein the memory module comprises a small outline dual in-line memory module (SODIMM), and the connector comprises a SODIMM connector.

16. The system of claim 7, further comprising an additional structure coupled to the second arm to provide a ground plane pathway to the printed circuit board; and an additional heat spreader coupled to the second arm.

17. The memory module connector of claim 1, wherein the heat spreader is configured to be brought into direct thermal contact with the memory module component through a configuration selected from the group consisting of a configuration including a thermal interface material between the heat spreader and the memory module component and a configuration including no thermal interface material between the heat spreader and the memory module component.

18. The system of claim 7, wherein the additional component and the heat spreader are in direct physical contact.

19. A memory module connector comprising:
a first arm,
a second arm,
a body portion extending between the first arm and the second arm, the body portion configured to accept a portion of a top surface and a bottom surface of a memory module configured to include a plurality of memory chips on at least one of the top surface and the bottom surface;
the first arm configured to hold a first side surface of the memory module;
the second arm configured to hold a second side surface of the memory module;
the first arm including a structure extending therefrom that is spaced apart from the body portion;
the first arm including a heat spreader extending therefrom that is spaced apart from the body portion; and
the structure and the heat spreader being positioned so that when the memory module is positioned in the memory module connector and the structure is coupled to a printed circuit board, a pathway is provided for heat to flow from a component on the memory module to the heat spreader, from the heat spreader to the first arm, from the first arm to the structure, and from the structure to the printed circuit board.

20. The memory module connector of claim 19, wherein the first arm includes a detent extending therefrom, the detent configured to fit into a recess on a side surface of the memory module.

* * * * *